(12) United States Patent
Zimmerman

(10) Patent No.: US 6,816,518 B2
(45) Date of Patent: Nov. 9, 2004

(54) WAVELENGTH TUNABLE HIGH REPETITION RATE OPTICAL PULSE GENERATOR

(75) Inventor: Micha Zimmerman, Haifa (IL)

(73) Assignee: Cyoptics (Israel) Ltd., Yokneam Illit (IL)

(*) Notice: Subject to any disclaimer, the term of this patent is extended or adjusted under 35 U.S.C. 154(b) by 0 days.

(21) Appl. No.: 10/099,564

(22) Filed: Mar. 15, 2002

(65) Prior Publication Data
US 2003/0016722 A1 Jan. 23, 2003

Related U.S. Application Data

(60) Provisional application No. 60/277,059, filed on Mar. 20, 2001.

(51) Int. Cl.$^7$ .................................................. H01S 3/10
(52) U.S. Cl. ............................ 372/20; 372/6; 372/25; 372/28; 372/32; 372/50; 372/96; 372/102
(58) Field of Search ............................ 372/6, 20, 25, 372/26, 28, 30, 50, 96, 102

(56) References Cited

U.S. PATENT DOCUMENTS

| | | | | |
|---|---|---|---|---|
| 5,155,737 A | * | 10/1992 | Ikeda et al. ................... | 372/43 |
| 5,305,336 A | | 4/1994 | Adar et al. ................... | 372/18 |
| 5,790,579 A | * | 8/1998 | Lee et al. ..................... | 372/45 |
| 6,031,851 A | * | 2/2000 | Shimizu et al. ............... | 372/18 |
| 6,195,188 B1 | * | 2/2001 | Sekiguchi ..................... | 359/124 |
| 6,295,306 B1 | * | 9/2001 | Asami .......................... | 372/20 |
| 6,389,047 B1 | * | 5/2002 | Fischer ......................... | 372/32 |
| 6,519,270 B1 | * | 2/2003 | Kim et al. ..................... | 372/28 |
| 6,580,739 B1 | * | 6/2003 | Coldren ........................ | 372/50 |
| 6,649,938 B1 | * | 11/2003 | Bogatov et al. .............. | 257/95 |

OTHER PUBLICATIONS

"Packaged hybrid soliton pulse source results and 270 Terabit.km/sec Soliton Transmission", P.A. Morton, et al., IEEE PTL, vol. 7, pp. 11–113, 1995.

H. Ishi, et al., "Super structure grating (SSG) for broadly tunable DBR lasers", IEEE PTL, 5, pp. 393–395, 1993.

V. Jayaraman, et al., "Theory, design and performance of extended tuning range semiconductor lasers with sampled grating", IEEE JQE, 29, pp. 1824–1834, 1993.

H. Ishii, et al., "Modified multiple–phase shift super–structure–grating DBR lasers for broad wavelength tuning", Elect. Lett., 30, pp. 1141–1142, 1994.

Rigole, "114nm Wavelength Tuning Range of a vertical grating assistant codirectional coupler laser with a super structure grating distributed bragg reflector", PTL, 7 1995.

"3.2 Tb/s (80×40 Gb/s) bi–directional DWDM/ETDM transmission", J.P. Elbers, et al., post–deadline paper PD2–5, ECOC 1999.

(List continued on next page.)

Primary Examiner—Stephone B. Allen
Assistant Examiner—Davienne Monbleau
(74) Attorney, Agent, or Firm—Ladas & Parry

(57) ABSTRACT

A laser, including a grating structure consisting of two or more gratings generating a plurality of different wavelength peaks for reflection of optical radiation therefrom. The laser also includes a semiconductor device having a gain region which is operative to amplify the optical radiation, and a wavelength tunable filter (WTF) region which is adapted to filter the optical radiation. The device is optically coupled to the grating structure so as to define a laser cavity having a plurality of cavity modes. The cavity modes are selected by tuning a wavelength pass-band of the WTF region to overlap with one of the wavelength peaks of the grating structure.

25 Claims, 3 Drawing Sheets

OTHER PUBLICATIONS

"5.5mm long InGaAS monolithic extended cavity laser with an Integrated Bragg–reflector for active mode–locking", P.B. Hansen, et al.IEEE PTL, vol. 4, pp. 215–217, 1992.

"Short pulse generation using multi–segment mode–locked semiconductor lasers", D.J. Derickson, et al., IEEE JQE, vol. 28, pp. 2186–2202, 1992.

"Monolithic colliding–pulse mode–locked quantum well lasers", Y.K. Chen, et al., IEEE JQE vol. 28, pp. 2176–2185, 1992.

Narrow line semiconductor laser using fibre grating, D.M. Bird, et al., Elec. Lett. vol. 27, pp. 1116–1117, 1991.

* cited by examiner

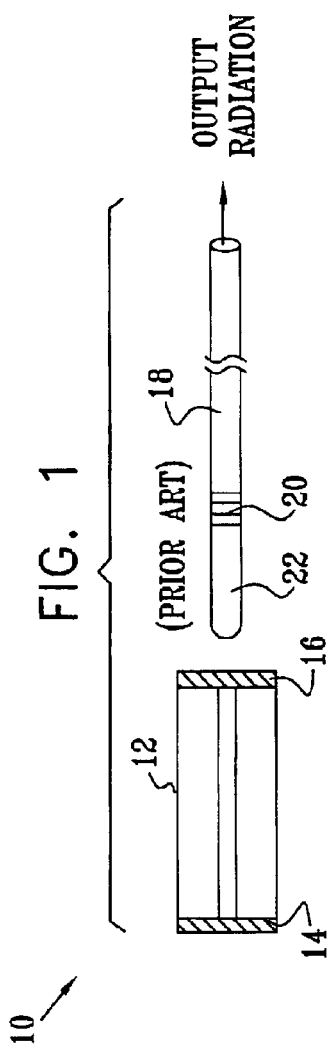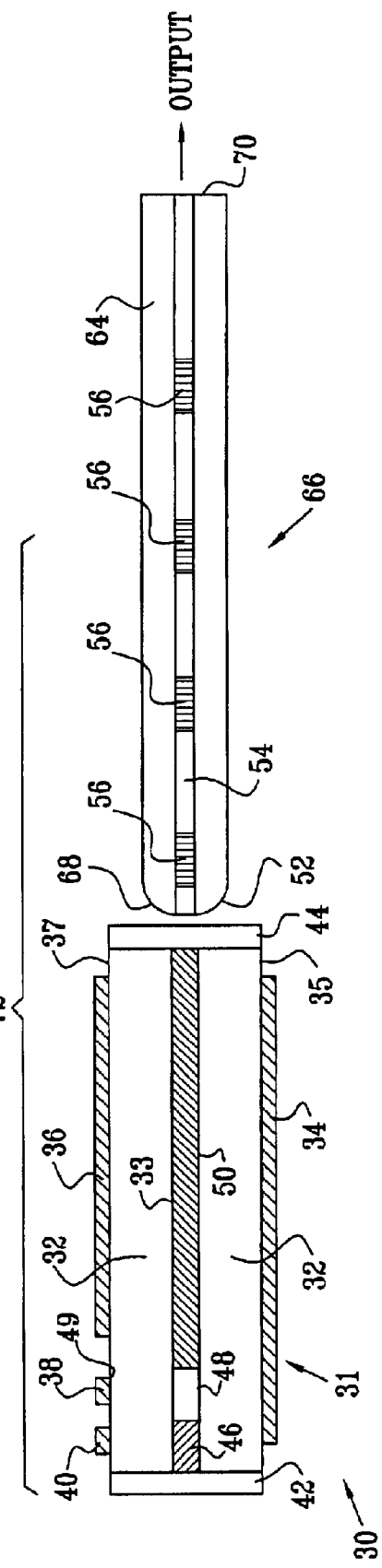

WAVELENGTH TUNABLE HIGH REPETITION RATE OPTICAL PULSE GENERATOR

CROSS-REFERENCE TO RELATED APPLICATIONS

This application claims the benefit of U.S. Provisional Patent Application No. 60/277,059, filed Mar. 20, 2001, which is incorporated herein by reference.

FIELD OF THE INVENTION

The present invention relates generally to semiconductor lasers, and specifically to tuning of semiconductor laser systems.

BACKGROUND OF THE INVENTION

The increase in demand for greater bandwidths in communications is driving interest in semiconductor laser systems. In order to accommodate the high bandwidths, a typical system may use 80 or more wavelength division multiplexed (WDM) channels, each channel being optically time division multiplexed (OTDM) at rates of 40 Gbit/s or more. Such systems are required to generate narrow pulses, having widths of the order of several picoseconds. Semiconductor laser chips can generate coherent radiation at wavelengths of the order of 1.5 $\mu$m (approximately 200 THz), and so can form an integral part of such a system. However, a drawback common to all monolithic semiconductor lasers is that control of their operating wavelengths, repetition rates, and pulse widths, is not sufficiently accurate for the WDM/OTDM system described above.

FIG. 1 is a schematic diagram of a semiconductor laser system 10, known in the art, which overcomes some of the drawbacks described above. A system similar to that of FIG. 1 is described in U.S. Pat. No. 5,305,336 to Adar et al. which is incorporated herein by reference. System 10 comprises a single-section semiconductor laser device 12 having a substantially 100% reflecting facet 14, and an antireflection-coated facet 16. Radiation from facet 16 is coupled into a fiber optic 18, which has a Bragg grating 20 inscribed in the optic. In some embodiments known in the art, grating 20 comprises a multi spectral features fiber Bragg grating (MSFFBG). Grating 20 acts as a second partial reflector, causing device 12 and section 22 of the fiber optic to function as a fiber grating laser (FGL) that generates coherent radiation at a wavelength defined by the grating.

In the system described by Adar et al, 20 ps pulses at repetition rates of 2.5 GHz were produced by actively mode-locking the cavity, forming a mode-locked FGL (ML-FGL). The linear chirp of the grating allowed tuning of the repetition rate to a desired frequency. However, this was also accompanied by self-tuning of the emission wavelength of the laser over the width of the grating. Furthermore, the length of the pulses produced, and use of the single-section laser device which was modulated as a whole, limit the repetition rate.

SUMMARY OF THE INVENTION

It is an object of some aspects of the present invention to provide apparatus and a method for producing high repetition rate optical pulses.

In a preferred embodiment of the present invention, a laser is implemented by optically coupling a monolithic device having an active semiconductor lasing region with a multi spectral features fiber Bragg grating (MSFFBG) inscribed in a fiber optic. The laser is able to support a plurality of longitudinal modes of vibration. The device comprises a semiconductor wavelength tunable filter (WTF) which acts as a relatively wide band-pass filter, enabling the laser to be tuned to a number of adjacent modes to the virtual exclusion of the others. Preferably, the device also comprises a saturable absorber (SA) which is modulated with a radio-frequency signal and which is situated in an operating section of the device so that the laser is mode-locked to generate short pulses. Combining the active lasing region, the saturable absorber, and the WTF in the monolithic device, and optically coupling the device to the MSFFBG, forms an efficient compact lasing system that is tunable and that is able to generate short optical pulses at a specific wavelength with a high repetition rate.

In some preferred embodiments of the present invention, the monolithic device also comprises a phase-change region and a passive waveguide region. Addition of these two regions to the operating section of the device enables the SA region to be accurately positioned, in a two step process, at an optical center of a cavity defined by the device and the MSFFBG. In a first step the SA region is physically implemented at an approximate optical center. In a second step the phase-change region is tuned to adjust a phase delay within the cavity so that the SA region is accurately at the optical center.

The WTF may be implemented either as a transmission filter or as a reflection filter. If implemented as a transmission filter, the WTF is preferably formed as a grating assisted co-directional coupler, which may be tuned using current injection and/or by changing the temperature of the WTF. As a transmission filter, the WTF may be positioned substantially anywhere within the operating section of the monolithic device.

If the WTF is implemented as a reflection filter, it is most preferably positioned adjacent to an end facet of the device, acting there as a highly reflecting mirror. The reflection WTF is preferably implemented as a distributed Bragg reflector (DBR), which may be tuned using current injection and/or by changing the temperature of the DBR. Alternatively, the reflection WTF is implemented as a multi spectral features Bragg grating (MSFBG), which may be tuned by methods known in the art.

There is therefore provided, according to a preferred embodiment of the present invention, a laser, including:

a grating structure, including two or more gratings generating a first plurality of different wavelength peaks for reflection of optical radiation therefrom; and a semiconductor device, including a gain region which is operative to amplify the optical radiation, and a wavelength tunable filter (WTF) region which is adapted to filter the optical radiation, the device being optically coupled to the grating structure so as to define a laser cavity having a second plurality of cavity modes, which are selected by tuning a wavelength pass-band of the WTF region to overlap with one of the wavelength peaks of the grating structure.

Preferably, the semiconductor device includes a saturable absorber which is adapted to be modulated so as to pulse the optical radiation.

Further preferably, the semiconductor device includes a highly reflective coated facet and an anti-reflection coated facet which bound the device, and the saturable absorber is positioned adjacent one of the facets.

Preferably, the semiconductor device includes an active phase-change region and a passive waveguide region which are adapted to position the saturable absorber centrally within an optical length of the laser cavity.

Further preferably, the active phase-change region implements a phase delay within the laser cavity so as to locate the saturable absorber at an optical center of the laser cavity.

Preferably, the WTF is implemented as a transmission band-pass filter.

Preferably, the semiconductor device includes an anti-reflection coated facet, and the WTF is implemented as a reflection band-pass filter located adjacent the anti-reflection coated facet.

Preferably, the grating structure includes a multi spectral features fiber Bragg grating (MSFFBG) inscribed in a fiber optic.

Further preferably, a width of a spectral feature of the MSFFBG is adjusted so as to determine a number of the plurality of the cavity modes.

There is further provided, according to a preferred embodiment of the present invention, a method for generating a laser output, including:

providing a grating structure generating a first plurality of different wavelength peaks for reflection of optical radiation therefrom;

optically coupling a semiconductor device to the structure so as to define a laser cavity, the device comprising a gain region which is operative to amplify the optical radiation and a wavelength tunable filter (WTF) region which is adapted to filter the optical radiation; and tuning a wavelength pass-band of the WTF region to overlap with one of the wavelength peaks of the grating structure so as to generate a laser output in a second plurality of cavity modes defined by the overlap.

Preferably, the semiconductor device includes a saturable absorber (SA), and including modulating the SA so as to pulse the optical radiation.

Further preferably, the semiconductor device includes a highly reflective coated facet and an anti-reflection coated facet which bound the device, and including positioning the saturable absorber adjacent one of the facets.

Preferably, the method includes locating an active phase-change region and a passive waveguide region within the semiconductor device so as to position the saturable absorber centrally within an optical length of the laser cavity.

Further preferably, the method includes utilizing the active phase-change region to implement a phase delay within the laser cavity so as to locate the saturable absorber at an optical center of the laser cavity.

Preferably, the WTF is implemented as a transmission band-pass filter.

Preferably, the semiconductor device includes an anti-reflection coated facet, and the WTF is implemented as a reflection band-pass filter located adjacent the anti-reflection coated facet.

Preferably, the grating structure includes a multi spectral features fiber Bragg grating (MSFFBG) inscribed in a fiber optic.

Further preferably, the method includes adjusting a width of a spectral feature of the MSFFBG so as to determine a number of the second plurality of the cavity modes.

Preferably, optically coupling the semiconductor device to the grating structure includes butting the device to the structure.

Preferably, optically coupling the semiconductor device to the grating structure includes positioning a lens intermediate the device and the structure.

Further preferably, the grating structure includes a multi spectral features fiber Bragg grating (MSFFBG) inscribed in a fiber optic, and the lens is integral to an end of the fiber optic.

Preferably, tuning the resonant wavelength includes varying a temperature of the WTF region.

Alternatively, tuning the resonant wavelength includes varying a current injected into the WTF region.

Preferably, the grating structure is implemented to determine a number of the second plurality of the cavity modes, so as to control a pulse width of the optical radiation.

The present invention will be more fully understood from the following detailed description of the preferred embodiments thereof, taken together with the drawings, in which:

BRIEF DESCRIPTION OF THE DRAWINGS

FIG. 1 is a schematic diagram of a semiconductor laser system known in the art;

FIG. 2 is a schematic sectional drawing of a tunable pulse generating laser system, according to a preferred embodiment of the present invention;

DETAILED DESCRIPTION OF PREFERRED EMBODIMENTS

Figure 3:
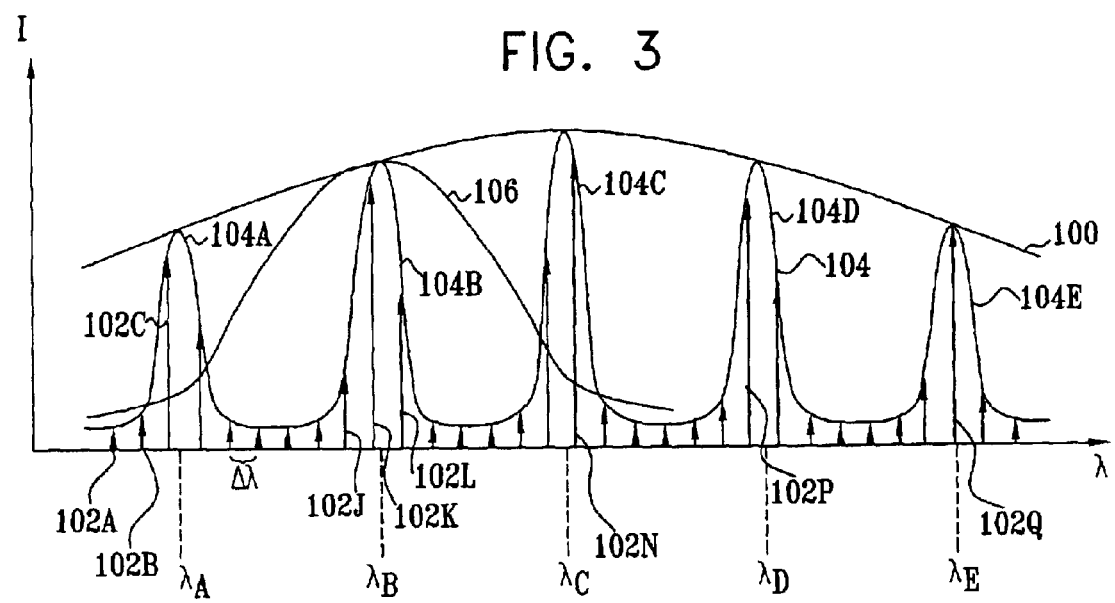
FIG. 3 shows schematic graphs of intensity vs. wavelength relationships for different elements of the system of FIG. 2, according to a preferred embodiment of the present invention.

Reference is now made to FIG. 2, which is a schematic sectional drawing of a tunable pulse generating laser system 30, according to a preferred embodiment of the present invention. System 30 comprises a monolithic semiconductor device 31, which is implemented with inert sections 32, and an operational section 33 between sections 32. Device 31 is bounded by two parallel facets; a first facet 42 is most preferably coated with a highly reflective coating, and a second facet 44 is coated with an anti-reflection coating. Section 33 comprises a gain region 50, a wavelength tunable filter (WTF) region 48, and a saturable absorber (SA) region 46. Regions 46 and 50 are preferably formed by respectively structuring the two regions of section 33 according to the function of the region, by methods known in the semiconductor art.

WTF region 48 is most preferably implemented as a grating assisted co-directional coupler (GACC), and acts as a transmission band-pass filter. Device 31 is implemented so that SA region 46 abuts facet 42. WTF region may be positioned anywhere between SA region 46 and facet 44, and by way of example is assumed to be between gain region 50 and region 46. Most preferably, a length of gain region 50 is substantially greater than a combined length of WTF region 48 and SA region 46. Typically, a length of WTF region 48 and a length of SA region 46 are each of the order of 30 $\mu$m, and a total length of device 31 is of the order of 300 $\mu$m–1000 $\mu$m.

A ground electrode 34 is implemented on a lower face 35 of device 31. An upper face 37 of device 31 has three separate electrodes 36, 38, 40 implemented thereon, correspondingly respectively with gain region 50, WTF region 48, and SA region 46. Each region may be separately activated by its respective electrode.

System 30 also comprises a fiber optic 64 within which is implemented a multi spectral feature fiber Bragg grating (MSFFBG) 66. MSFFBG 66 is most preferably formed from a plurality of discrete fiber gratings known as a superstructure grating (SSG) 56, which is inscribed within the fiber optic by methods known in the art. Preferably, a lens 52 is formed as an integral part of a first end 68 of fiber optic 64, end 68 being closest to facet 44. During operation of system 30, which is described in more detail below, lens 52 couples radiation between gain region 50 and MSFFBG 66. Alternatively, other methods known in the art for coupling MSFFBG 66 with gain region 50 are used. For example, lens 52 may comprise one or more lenses distinct from fiber optic 64, or end 68 of the fiber optic may be butted, with or without a mode converter, directly to facet 44. MSFFBG 66 acts as a semi-reflecting mirror for system 30, effectively forming a cavity 72 between the MSFFBG and facet 42. Radiation generated within cavity 72 is transmitted from the MSFFBG and is output at a second end 70 of fiber optic 64.

In operation, SA region 46 is activated by a DC reverse bias and a radio-frequency (RF) modulation being applied to electrode 40; WTF region 48 is activated by DC current injection at electrode 38; and gain region 50 is activated by applying DC excitation to electrode 36. Mode-locked coherent pulses are produced by system 30 acting as cavity 72, the cavity having longitudinal modes of vibration which are maintained between facet 42 and an effective length associated with MSFFBG 66.

The combination of DC bias and RF modulation applied to SA region 46 produces a periodic absorption in the region, resulting in a short time interval during which system 30 experiences net gain. The short time interval is further shortened by SA region 46 being positioned adjacent to high reflection coated facet 44, causing pulses generated within device 31 to collide with their reflections. The overall effect of the positioning of SA region 46, and current flow in the region, is that the system is able to produce pulses having widths of the order of tens of picoseconds or less, when appropriate RF modulation is applied.

WTF region 48 acts as a transmission filter having a relatively wide band-pass. Tuning of a central frequency of the filter is most preferably implemented by varying current injected into electrode 38. Alternatively or additionally, the filter is tuned by changing its temperature. Temperature variation may be implemented by any convenient method known in the art, such as by forming a small resistor 49 in place of and/or in addition to electrode 38, or in a region of device 31 close to section 48, and using the resistor as a heating element.

FIG. 3 shows schematic graphs of intensity vs. wavelength relationships for different elements of system 30, according to a preferred embodiment of the present invention. A graph 100 corresponds to an overall gain curve of system 30, the curve being a function of individual gains of components of the system. Cavity 72 has a multitude of longitudinal cavity modes like 102A, 102B, 102C, . . . separated by $\Delta\lambda$, with wavelengths which are a function of an optical length of the cavity and the number of half-wavelengths comprising the mode. A graph 104 corresponds to the overall resonant curve of MSFFBG 66, wherein each peak 104A, 104B, 104C, . . . of the graph is a relatively narrow resonant curve of corresponding SSG 56 at respective central wavelengths $\lambda_A$, $\lambda_B$, $\lambda_C$, . . . .

A graph 106 corresponds to the wavelength pass-band of WTF region 48. WTF region 48 is implemented so that its wavelength pass-band substantially encloses only one of the peaks of graph 104. Thus in FIG. 3, only longitudinal cavity modes within peak 104B at $\lambda_B$, such as modes 102J, 102K, and 102L, will resonate since WTF region 48 is tuned to this wavelength region. Modes such as 102N, 102P, and 102Q will be substantially suppressed since they are on the wings of graph 106 and will not lase. As described above, WTF region 48 is tunable, so that for modes within peak 104A to resonate the region is tuned to lower wavelength $\lambda_A$. Similarly, for modes within peaks 104C, 104D, and 104E to resonate, region 48 is respectively tuned to higher wavelengths $\lambda_C$, $\lambda_D$, $\lambda_E$. Thus system 30 can be effectively scanned from $\lambda_A$ to $\lambda_E$ by tuning WTF region 48 across the same wavelength range. The control of the number of adjacent longitudinal modes which lase defines the width of the pulse emitted by system 30. The number of modes can be controlled by adjusting the width of the spectral features of the MSFFBG.

Figure 4:
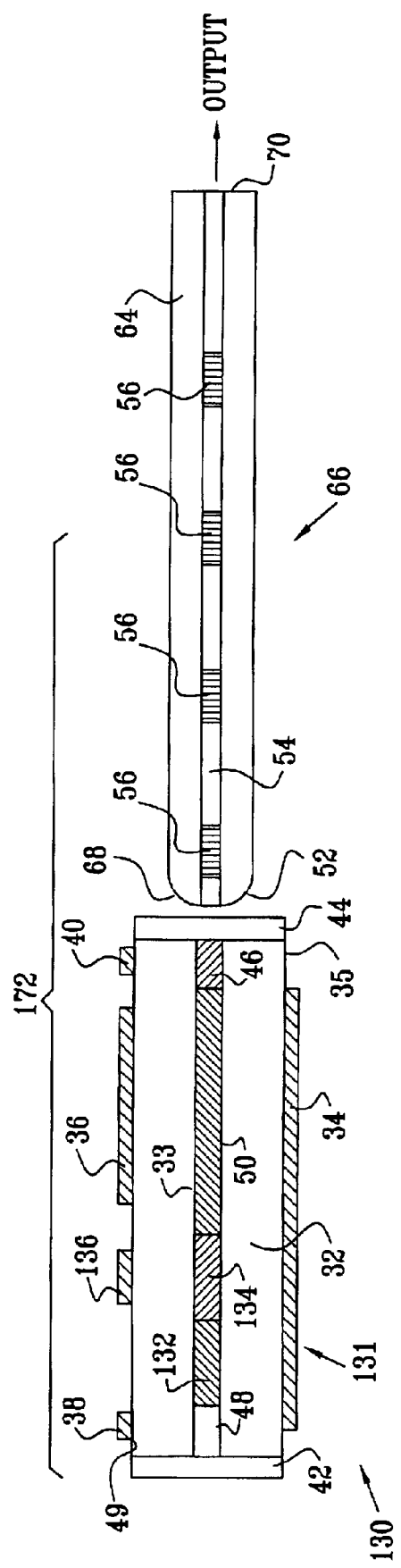
FIG. 4 is a schematic sectional drawing of an alternative tunable pulse generating laser system, according to a preferred embodiment of the present invention.

FIG. 4 is a schematic sectional drawing of an alternative tunable pulse generating laser system 130, according to a preferred embodiment of the present invention. Apart from the differences described below, the operation of system 130 is generally similar to that of system 30 (FIG. 2), so that elements indicated by the same reference numerals in both systems 130 and 30 are generally identical in construction and in operation. A semiconductor device 131 has WTF region 48 positioned adjacent highly reflective coated facet 42, SA region 46 positioned adjacent anti-reflection coated facet 44, and gain region 50 positioned between the WTF region and the SA region. Regions 46, 48, and 50 are activated by their respective electrodes 40, 38, and 36, substantially as described above for device 31.

Device 131 further comprises an active phase-change region 134, activated by an electrode 136 on upper face 37 of the device, in section 33. A passive waveguide region 132 is also implemented in section 33.

In contrast to device 31, SA region 46 of device 131 is positioned approximately centrally within a cavity 172 formed between facet 42 and an effective length associated with MSSFBG 66, by passive waveguide region 132 having its length implemented accordingly. During operation of device 131, a phase delay introduced by phase-change region 134 is fine tuned, by adjusting current injected at electrode 136, so that SA region 46 is effectively located at an optical center of cavity 172. Positioning SA region 46 at the optical center of cavity 172 has substantially the same effect on pulses within the cavity as positioning the region adjacent to reflecting facet 42 of the cavity. That is, the pulses are shortened due to the fact that counter propagating pulses collide within SA region 46.

It will be appreciated that since WTF region 48 acts as a transmission band-pass filter, it may be positioned substantially anywhere within section 33, providing SA region 46 may be positioned at the optical center of cavity 172. As for device 31, transmission WTF region 48 in device 131 is tuned by current injection at electrode 38, and/or temperature change of the region.

In an alternative embodiment of system 130, WTF region 48 is implemented as a reflection type filter, most preferably by implementing the filter as a distributed Bragg reflector (DBR) or as a multi spectral features Bragg grating (MSFBG), for example, in the case of an MSFBG, as an SSG. When WTF region 48 acts as a reflector, it is positioned adjacent to facet 42, and in this case facet 42 is anti-reflection coated. If reflection WTF region 48 is implemented as a DBR, it is preferably tuned by current injection via electrode 38, and/or by temperature change of the region. If reflection WTF region 48 is implemented as an MSFBG, it is preferably tuned by methods which are known in the art.

It will be appreciated that the preferred embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

What is claimed is:

1. A laser, comprising:
   a grating structure, comprising an optical fiber that comprises a super structure grating (SSG), generating a plurality of different wavelength peaks for reflection of optical radiation therefrom; and
   a semiconductor device, comprising:
      a gain region which is activated by direct current (DC) excitation so as to amplify the optical radiation, and a wavelength tunable filter (WTF) region which filters the optical radiation, the device being optically coupled to the grating structure so as to define a laser cavity having a multiplicity of cavity modes, which are selected by tuning a wavelength pass-band of the WTF region to overlap with one of the wavelength peaks of the grating structure so as to choose a selected wavelength; and
      a saturable absorber region which is modulated with a radio-frequency (RF) modulation that is substantially independent of the selected wavelength so as to pulse the optical radiation.

2. A laser according to claim 1, wherein the semiconductor device comprises a highly reflective coated facet and an anti-reflection coated facet which bound the device, and wherein the saturable absorber region is positioned adjacent one of the facets.

3. A laser according to claim 1, wherein the semiconductor device comprises an active phase-change region and a passive waveguide region which position the saturable absorber region centrally within an optical length of the laser cavity.

4. A laser according to claim 3, wherein the active phase-change region implements a phase delay within the laser cavity so as to locate the saturable absorber region at an optical center of the laser cavity.

5. A laser according to claim 1, wherein the WTF is implemented as a transmission band-pass filter.

6. A laser according to claim 1, wherein the semiconductor device comprises an anti-reflection coated facet, and wherein the WTF is implemented as a reflection band-pass filter located adjacent the anti-reflection coated facet.

7. A laser according to claim 1, wherein a width of a spectral feature of the SSG is adjusted so as to determine a number of the multiplicity of the cavity modes.

8. A laser according to claim 1, wherein the grating structure is implemented to determine a number of the multiplicity of the cavity modes, so as to control a pulse width of the optical radiation.

9. A laser according to claim 1, wherein the gain region has a gain length, the WTF region has a WTF length, and the saturable absorber region has a saturable absorber length, and wherein the gain length is substantially greater than a sum of the WTF length and the saturable absorber length.

10. A laser according to claim 9, wherein the WTF length and the saturable absorber length are each of the order of 30 $\mu$m, and wherein a total of the gain length and the WTF length and the saturable absorber length as of the order of 300 $\mu$m to 1000 $\mu$m.

11. A method for generating a laser output, comprising:
    providing a grating structure, comprising an optical fiber that comprises a super structure grating (SSG), and generating a plurality of different wavelength peaks for reflection of optical radiation therefrom;
    optically coupling a semiconductor device to the structure so as to define a laser cavity, the device comprising a saturable absorber region and a gain region which is activated by direct current (DC) excitation so as to amplify the optical radiation and a wavelength tunable filter (WTF) region which filters the optical radiation;
    tuning a wavelength pass-band of the WTF region to overlap with one of the wavelength peaks of the grating structure so as to generate a laser output in a selected wavelength of a multiplicity of cavity modes defined by the overlap; and
    modulating the saturable absorber region with a radio-frequency (RF) modulation that is substantially independent of the selected wavelength so as to pulse the optical radiation.

12. A method according to claim 11, wherein the semiconductor device comprises a highly reflective coated facet and an anti-reflection coated facet which bound the device, and comprising positioning the saturable absorber region adjacent one of the facets.

13. A method according to claim 11, and comprising locating an active phase-change region and a passive waveguide region within the semiconductor device so as to position the saturable absorber region centrally within an optical length of the laser cavity.

14. A method according to claim 13, and comprising utilizing the active phase-change region to implement a phase delay within the laser cavity so as to locate the saturable absorber region at an optical center of the laser cavity.

15. A method according to claim 11, wherein the WTF is implemented as a transmission band-pass filter.

16. A method according to claim 11, wherein the semiconductor device comprises an anti-reflection coated facet, and wherein the WTF is implemented as a reflection band-pass filter located adjacent the anti-reflection coated facet.

17. A method according to claim 11, and comprising adjusting a width of a spectral feature of the SSG so as to determine a number of the multiplicity of the cavity modes.

18. A method according to claim 11, wherein optically coupling the semiconductor device to the grating structure comprises butting the device to the structure.

19. A method according to claim 11, wherein optically coupling the semiconductor device to the grating structure comprises positioning a lens intermediate the device and the structure.

20. A method according to claim 19, wherein the lens is integral to an end of the fiber optic.

21. A method according to claim 11, wherein tuning the wavelength pass-band comprises varying a temperature of the WTF region.

22. A method according to claim 11, wherein tuning the wavelength pass-band comprises varying a current injected into the WTF region.

23. A method according to claim 11, wherein the grating structure is implemented to determine a number of the multiplicity of the cavity modes, so as to control a pulse width of the optical radiation.

24. A method according to claim 11, wherein the gain region has a gain length, the WTF region has a WTF length, and the saturable absorber region has a saturable absorber length, and wherein the gain length is substantially greater than a sum of the WTF length and the saturable absorber length.

25. A method according to claim 24, wherein the WTF length and the saturable absorber length are each of the order of 30 $\mu$m, and wherein a total of the gain length and the WTF length and the saturable absorber length is of the order of 300 $\mu$m to 1000 $\mu$m.

* * * * *